(12) United States Patent
Cao

(10) Patent No.: US 7,786,499 B2
(45) Date of Patent: Aug. 31, 2010

(54) REPLACEABLE THROUGH-HOLE HIGH FLUX LED LAMP

(75) Inventor: Densen Cao, Sandy, UT (US)

(73) Assignee: CAO Group, Inc., West Jordan, UT (US)

( * ) Notice: Subject to any disclaimer, the term of this patent is extended or adjusted under 35 U.S.C. 154(b) by 8 days.

(21) Appl. No.: 11/969,194

(22) Filed: Jan. 3, 2008

(65) Prior Publication Data

US 2008/0111150 A1 May 15, 2008

Related U.S. Application Data

(63) Continuation-in-part of application No. 11/397,323, filed on Apr. 4, 2006.

(51) Int. Cl.
| H01L 27/15 | (2006.01) |
| H01L 29/26 | (2006.01) |
| H01L 31/12 | (2006.01) |
| H01L 33/00 | (2006.01) |

(52) U.S. Cl. .......................... 257/99; 257/98; 257/100; 257/79

(58) Field of Classification Search ................... 257/79, 257/81, 99, 431, 433, 98, 100
See application file for complete search history.

(56) References Cited

U.S. PATENT DOCUMENTS

| 4,240,090 | A | * | 12/1980 | Hughes et al. ................ 257/99 |
| 4,394,679 | A | * | 7/1983 | Hawrylo ....................... 257/99 |
| 5,055,892 | A | * | 10/1991 | Gardner et al. ................ 257/99 |
| 5,595,438 | A | * | 1/1997 | Burd ........................... 362/228 |
| 6,355,946 | B1 | * | 3/2002 | Ishinaga ....................... 257/98 |
| 6,541,800 | B2 | * | 4/2003 | Barnett et al. ................ 257/98 |
| 6,903,380 | B2 | * | 6/2005 | Barnett et al. ................ 257/98 |
| 7,196,358 | B1 | * | 3/2007 | Chen ........................... 257/98 |
| 7,490,959 | B2 | * | 2/2009 | Tsuda ........................ 362/267 |
| 2002/0113244 | A1 | * | 8/2002 | Barnett et al. ................ 257/98 |
| 2004/0095738 | A1 | * | 5/2004 | Juang ......................... 361/815 |
| 2004/0201025 | A1 | * | 10/2004 | Barnett et al. ................ 257/79 |
| 2005/0194607 | A1 | * | 9/2005 | Barnett et al. ................ 257/99 |
| 2006/0138440 | A1 | * | 6/2006 | Jyo ............................. 257/98 |
| 2008/0105886 | A1 | * | 5/2008 | Borner et al. ................. 257/98 |
| 2008/0197374 | A1 | * | 8/2008 | Sung ........................... 257/99 |

* cited by examiner

*Primary Examiner*—Leonardo Andújar
*Assistant Examiner*—Teresa M Arroyo

(57) ABSTRACT

The present invention is a through-hole LED light source with capability of emitting a beam angle of less than 75 degrees. The light source presents a three-dimensional lead frame with a well, into which at least one LED is mounted, and an optical housing which serves as a directional lens. Through adjustment of the housing and lead well properties, beam angle is adjusted to any angle. The frame is three-dimensional, preferably cylindrical, with both inner and outer portions, electrically isolated. The inner portion serves as the mounting area for the LEDs (and contains the well) and the LED serves as the electrical conduit between the portions, completing a circuit an illuminating the LED.

6 Claims, 4 Drawing Sheets

REPLACEABLE THROUGH-HOLE HIGH FLUX LED LAMP

CROSS-REFERENCES TO RELATED APPLICATIONS

This Application claims priority as a continuing-in-part Application of prior filed U.S. application Ser. No. 11/397,323, filed Apr. 4, 2006 and incorporates the same by reference in its entirety.

FIELD OF THE INVENTION

The present invention relates to the field of high flux light emitting diodes (LEDs) and more particularly relates to a lighting device and more particularly relates to a lighting device utilizing replaceable through-hole high flux LEDs as a light source.

BACKGROUND OF THE INVENTION

Light emitting diodes (LEDs) are being explored as a light source for general lighting. The important characteristics for LEDs as light source are high efficiency and long life time. In lighting applications, the LEDs chips must be packaged to manage electrical, optical and heat requirements. Surface-mount type LEDs have been widely produced and used in lighting applications. However, there are shortcomings in surface-mount type LEDs. The most critical problem for surface-mount type LED is that these LEDs are mounted on an printed circuit board and not replaceable when an LED is broken, which may occur for a number of reasons. This causes a huge service problem. Another critical problem for surface-mount type LEDs is light beam angle. It is problematic for most surface-mount type LEDs to have a light beam angle smaller than 75 degrees.

This invention discloses a new type of LED with a character of replaceable and desired beam angle.

The present invention represents a departure from the prior art in that the LED light source of the present invention allows for the use of replaceable through-hole LEDs. As such they are replaceable and can present a smaller light beam angle.

SUMMARY OF THE INVENTION

In view of the foregoing disadvantages inherent in the known types of LED light sources, this invention provides a replaceable through-hole LED light source. As such, the present invention's general purpose is to provide a new and improved LED light source that is convenient and easy to use and manufacture and will also be capable of emitting light at beam angles less than 75 degrees.

To accomplish these objectives, the LED light source comprises a three-dimensional, cylindrical lead frame with a well into which at least on LED chip is mounted. An optical housing encapsulates the frame and chip and serves as a directional lens. Desired beam angle is obtained by adjusting the housing's height and shape, while also adjusting the well dimensions. The lead frame is three-dimensional, preferably cylindrical, and is comprised of two electrically isolated structures. The well is located on the inner structure and the LED and connecting wires serve as the electrical conduit between the structures, thereby completing a circuit and illuminating the LED.

The more important features of the invention have thus been outlined in order that the more detailed description that follows may be better understood and in order that the present contribution to the art may better be appreciated. Additional features of the invention will be described hereinafter and will form the subject matter of the claims that follow.

Many objects of this invention will appear from the following description and appended claims, reference being made to the accompanying drawings forming a part of this specification wherein like reference characters designate corresponding parts in the several views.

Before explaining at least one embodiment of the invention in detail, it is to be understood that the invention is not limited in its application to the details of construction and the arrangements of the components set forth in the following description or illustrated in the drawings. The invention is capable of other embodiments and of being practiced and carried out in various ways. Also it is to be understood that the phraseology and terminology employed herein are for the purpose of description and should not be regarded as limiting.

As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF THE PREFERRED EMBODIMENT

Figure 1:
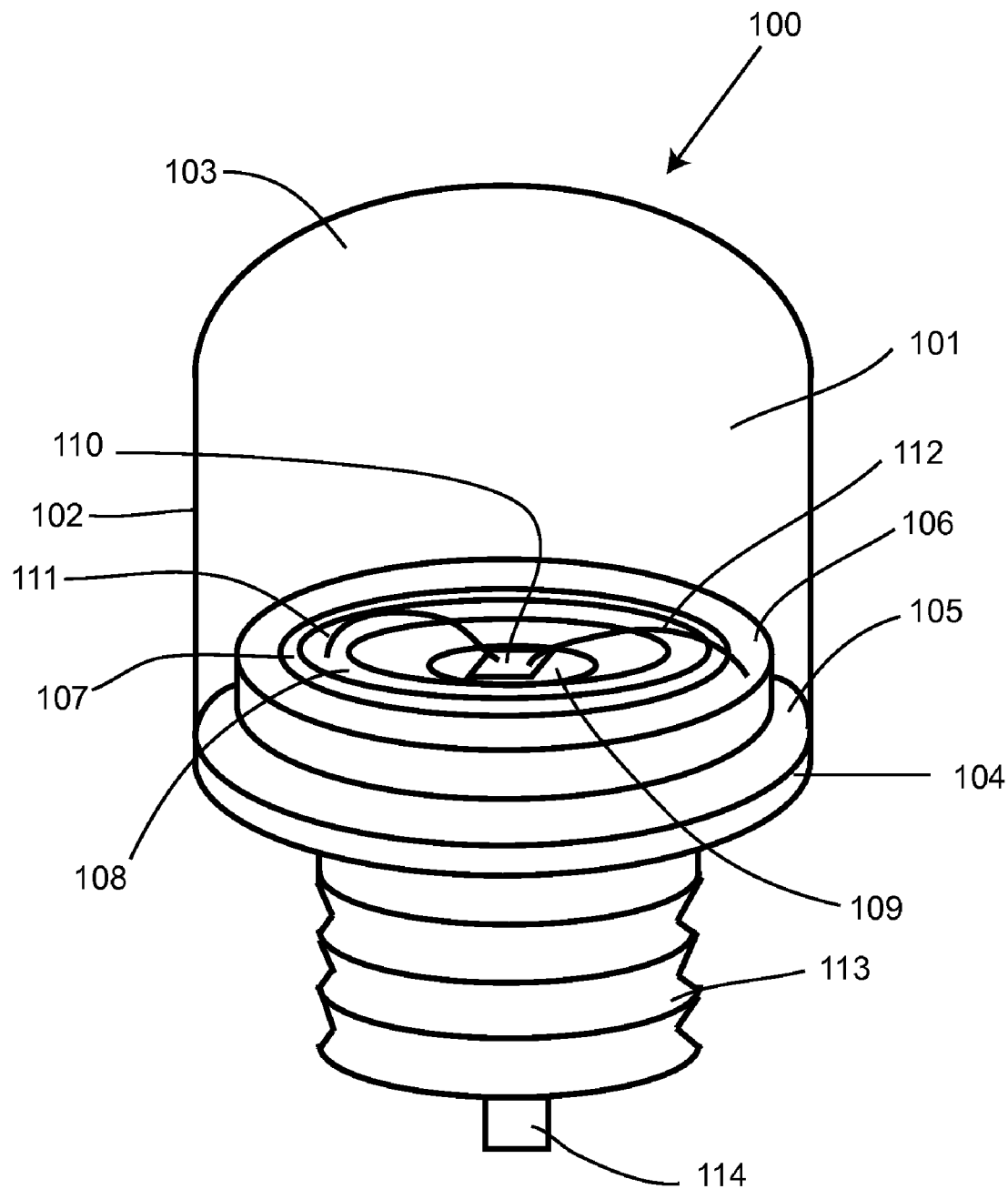
FIG. 1 is a top perspective view of one embodiment of the present invention.

With reference now to the drawings, the preferred embodiment of the LED lighting source is herein described. It should be noted that the articles "a", "an", and "the", as used in this specification, include plural referents unless the content clearly dictates otherwise. FIG. 1 depicts an overall picture of invented light source 100 using an LED chip 110. A lead frame 104 is encapsulated by an optical housing 101 having a wall 102 and a lens 103. In the lead frame 104, there is step 105 to support the optical housing 101, a circular outer housing 106, an insulation layer 107, and an inner housing 108 with a well 109. An LED chip 110 is attached in the well 109. Two electrical conducting wires 111 and 112 connect chip 110 to the frame outer housing 106 and inner housing 108. Lead frame 104 has a base 113 with standard threading. An electrode 114 is axially located and extends out of the base 113.

Figure 2:
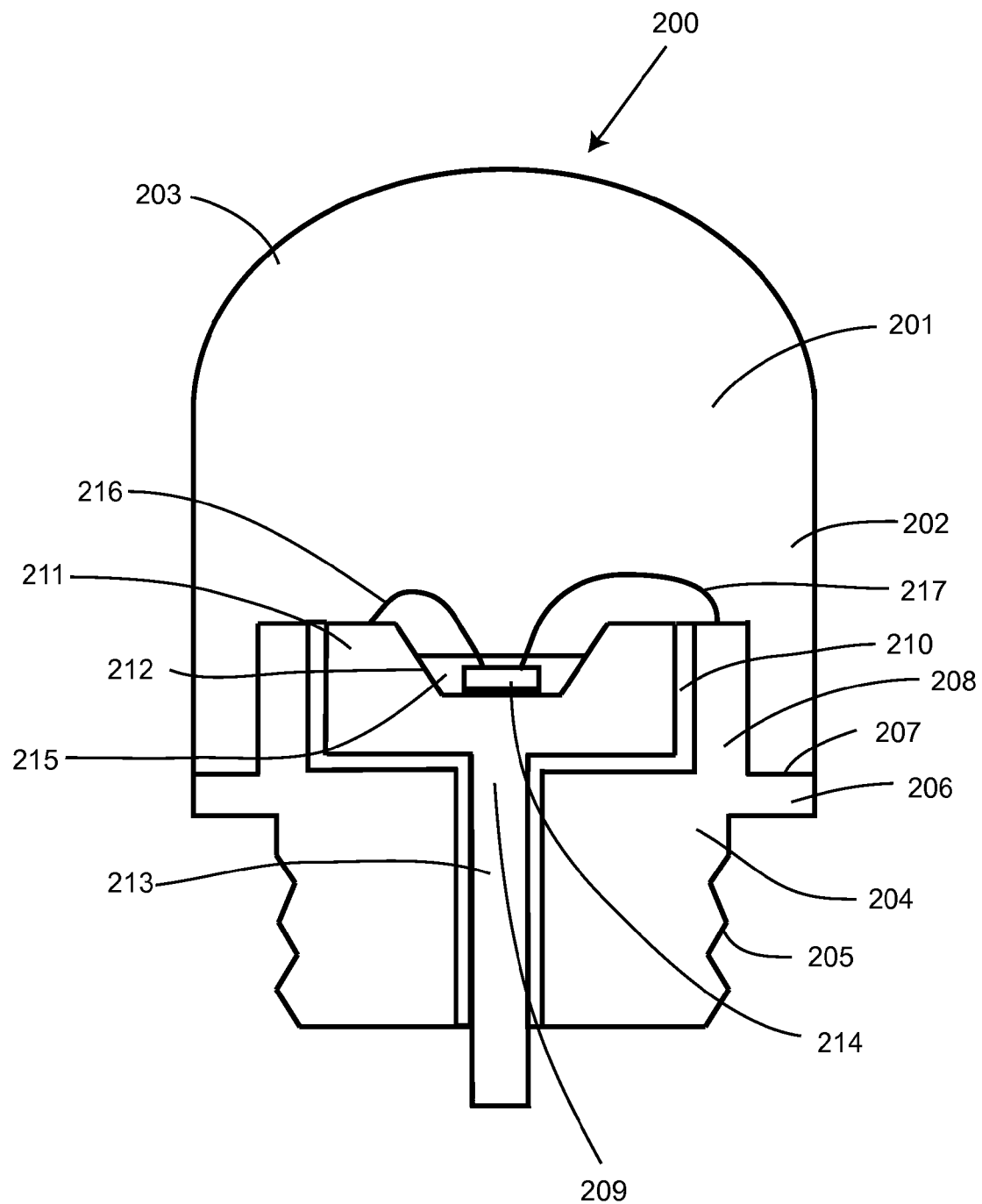
FIG. 2 is a cross-sectional view of the embodiment depicted in FIG. 1.

FIG. 2 depicts the cross-sectional profile 200 of invented LED with a single chip, as illustrated in FIG. 1. The lead frame 204 is a three-dimensional cylinder type with a base 205 with a standard thread in the outside and is encapsulated by optical housing 201 with wall 202 and lens 203 as described above in FIG. 1. A circular disk 206 above base 205 with a step 207 and a circular wall 208, which is the outer housing 106 in FIG. 1, supports the optical housing 201. Inside the base 204, there is a Y-shaped hole 209 with an insulation layer 210 between base 204 and mounting structure 209. In structure 209, there is a base 211 containing a well 212 and a conducting stem 213. The pin-type conducting stem 213 is essentially the electrode 114 in FIG. 1. In the well 212, a LED chip 214 is mounted. Shoulder 211 is essentially the same as inner housing 108 in FIG. 1. It is possible, though not necessary, to use a phosphor material 215 to cover the chip 215 and change the color emitted by the light source. There are conduction wires 216 and 217 connect the chip's electrode to the lead frame 204 and 209, respectively.

Figure 3:
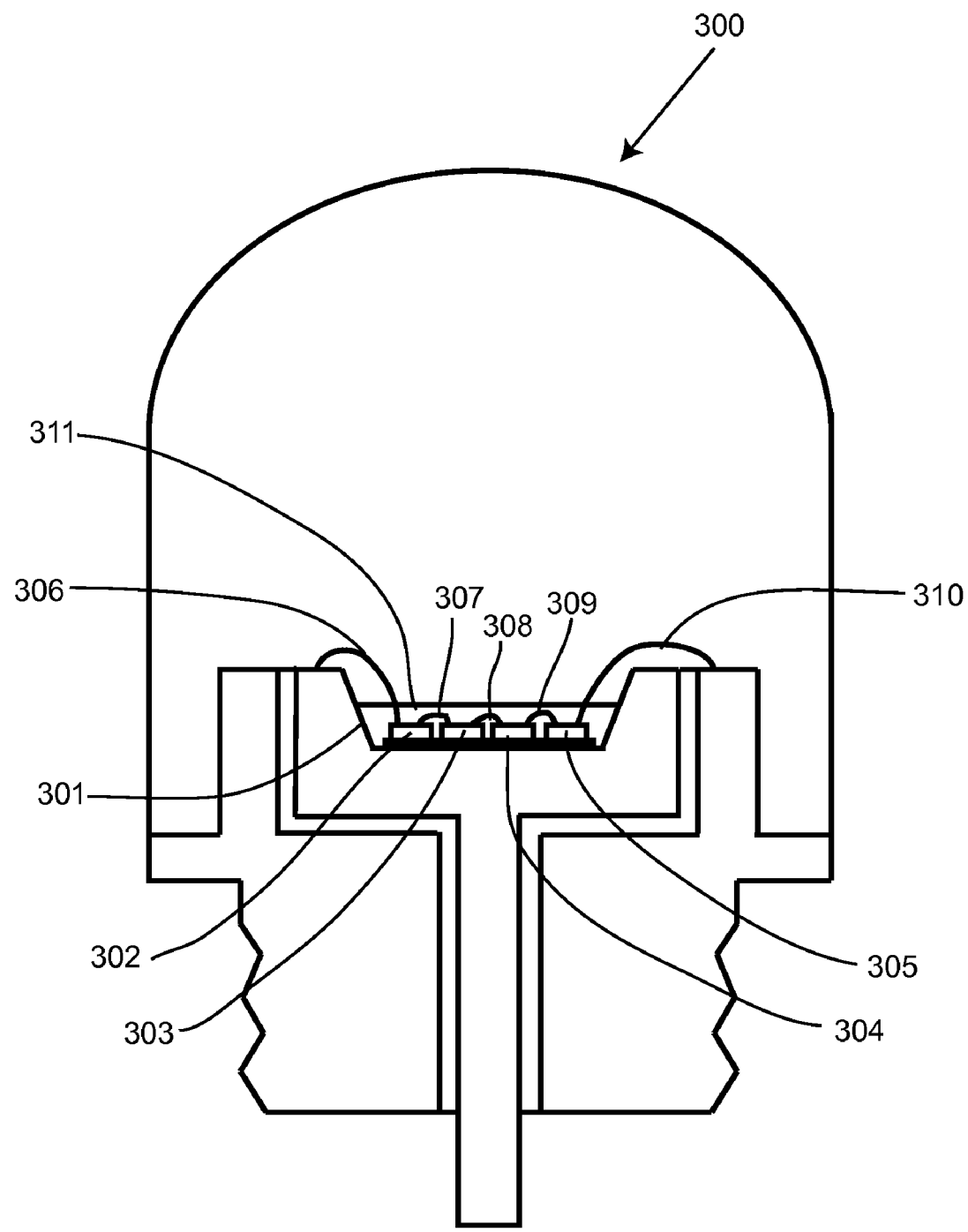
FIG. 3 is a cross-sectional view of an alternate embodiment of the invention.

FIG. 3 depicts the cross-sectional profile of invented light source using multiple chips or an array of LED chips in the well as light source. The lead frame structure is the same as depicted in FIG. 2. In the well 301, there is a number of chips, 302, 303, 304, and 305 seated in the bottom of the well, then connected to lead frame with conduction wire 306, and 310. The chips are connected with wire 307, 308, and 309, respectively. The number of chips can be one to infinity. The chips can be single color or multiple colors. The chips in the well can be either multiple individual chips or an array of chips, depending on the manufacturer's specifications. There is a possibility that a phosphor layer 311 may be used to cover the chips to convert the light into different color.

Figure 4:
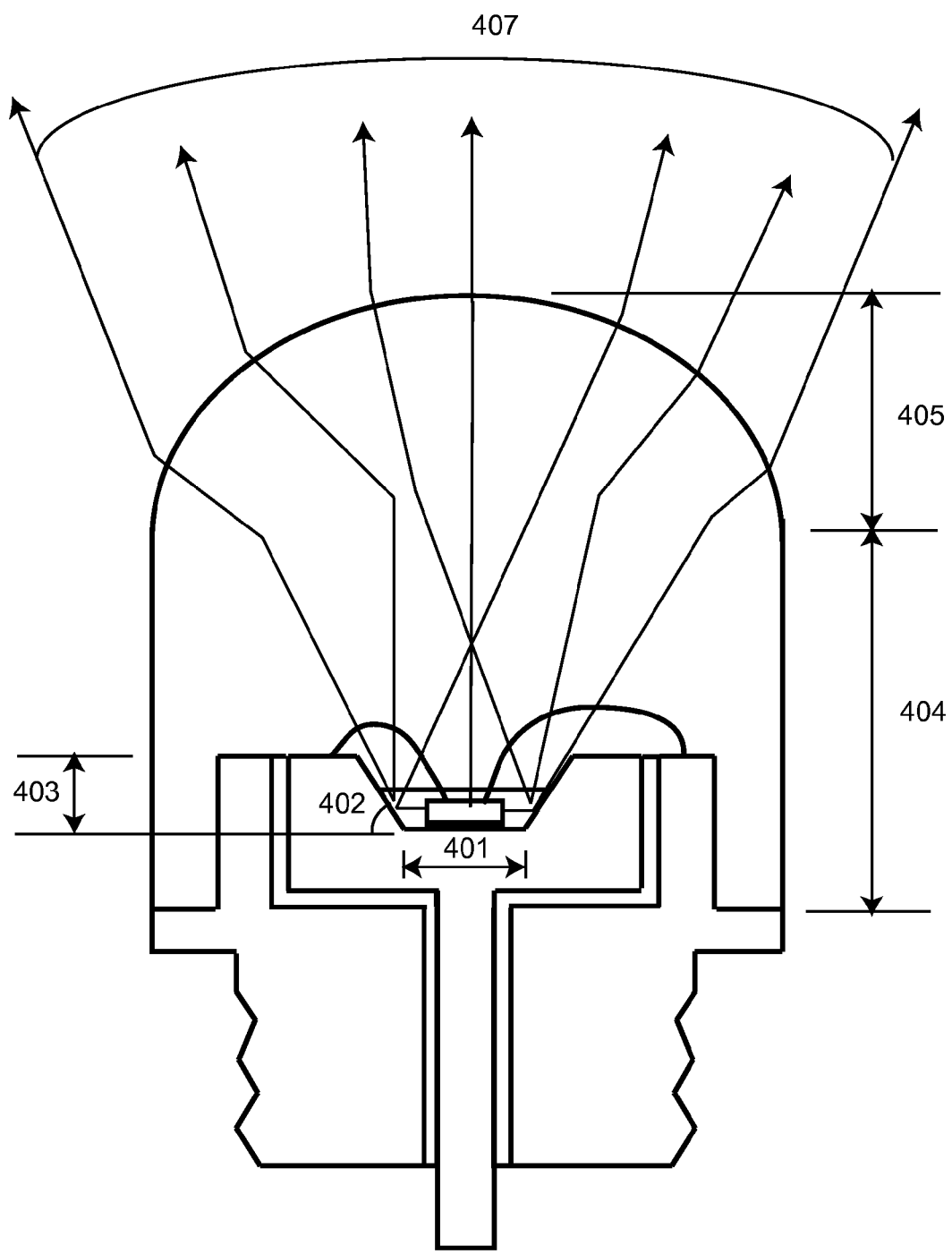
FIG. 4 is the cross-sectional view of FIG. 2, illustrating the concept of beam angle and the achievement of desired beam angle.

FIG. 4 depicts the principle of beam angle with invented LED. The key parameters to define the beam angle are described in FIG. 4. The width of the well base is 401, defines how many chips may be placed in the well. The angle of the well wall 402 and height of well wall 403 define the opening of the well and, consequently, the arc of light being emitted. The wall height 404 of optical housing defines the light beam traveling distance before the light beam is focused again. On top of optical housing, there is lens with a thickness, height 405 and curvature 406. Through use of known optical principles and a combination of well wall angle, optical housing height, and lens height and curvature, the optical beam can be adjusted in any desired angle 407 which can be ranged from 5 degrees to 180 degrees, including the range between 5 and 75 degrees which is problematic for surface mount LEDs. Choice of materials will necessarily also be utilized in making the calculations. Any conductive material may be used for the lead frame components, and the inner and outer lead frame may or may not be of the same material. Any suitable material may be used for the optical housing and lens, such as glass or plastic.

Although the present invention has been described with reference to preferred embodiments, numerous modifications and variations can be made and still the result will come within the scope of the invention. No limitation with respect to the specific embodiments disclosed herein is intended or should be inferred.

What is claimed is:

1. A replaceable through-hole LED light source comprising:
    an electrically conductive hollow outer lead frame having a threaded lower portion and an upper rim, said upper rim having a first annular portion of outer radius r1 and a second annular portion of outer radius r2 extending upwardly from the first annular portion, wherein r2 is less than r1, said first annular portion and said second annular portion providing a step and a wall, respectively, to receive and support an optical housing;
    an electrically conductive inner lead frame, disposed within the outer lead frame, comprising a well in an upper portion of the inner lead frame and a shaft portion that extends axially through and out of the threaded lower portion of the outer lead frame;
    an insulation layer electrically isolating the inner and outer lead frames;
    at least one LED mounted within the well and electrically connected to the inner and outer lead frames; and
    an optical housing mounted upon the rim of the outer lead frame, said housing having a height and a curvature, said housing further having an annular base portion having a thickness equal to r1 minus r2 and an inner wall of radius r2 adjacent said annular base portion to support said optical housing against said upper rim, said inner wall being configured to abut the upwardly extending second annular portion of the upper rim and said annular base portion being configured to abut the step of the upper rim.

2. The LED light source of claim 1, the at least one LED being a plurality of LEDs.

3. The LED light source of claim 2, the plurality of LEDs being arranged in an array.

4. The LED light source of claim 2, further comprising LEDs within the plurality of LEDs emitting different wavelengths of light.

5. The LED light source of claim 2, further comprising a phosphor coating over the LEDs.

6. The LED light source of claim 1, further comprising a phosphor coating over the LEDs.

* * * * *